United States Patent [19]

Holland

[11] 4,408,658
[45] Oct. 11, 1983

[54] APPARATUS AND METHOD FOR HEATING A MATERIAL IN A TRANSPARENT AMPOULE

[75] Inventor: Lawrence R. Holland, Huntsville, Ala.

[73] Assignee: The United States of America as represented by the Administrator of the National Aeronautics and Space Administration, Washington, D.C.

[21] Appl. No.: 280,151

[22] Filed: Jun. 30, 1981

[51] Int. Cl.³ .................... H05B 1/00; F27D 11/00; C30B 1/00; C30B 35/00
[52] U.S. Cl. .......................................... 165/2; 165/58; 219/354; 219/390; 219/343; 219/411; 156/600; 156/610; 156/DIG. 73; 156/DIG. 89; 350/316
[58] Field of Search ............... 219/354, 343, 405, 411, 219/390, 347; 34/4; 165/61, 30, 58; 156/610, 600, 616 R, DIG. 73, DIG. 89; 422/25; 250/352, 339; 350/316

[56] References Cited

U.S. PATENT DOCUMENTS

| | | | |
|---|---|---|---|
| 3,494,723 | 2/1970 | Gray | 422/21 |
| 3,674,422 | 7/1972 | Gray | 422/21 |
| 3,817,710 | 6/1974 | Mizutani et al. | 219/354 |
| 3,862,397 | 1/1975 | Anderson et al. | 219/343 |
| 4,076,071 | 2/1978 | Rosenkranz et al. | 219/354 |

Primary Examiner—William R. Cline
Assistant Examiner—John K. Ford
Attorney, Agent, or Firm—Leon D. Wofford, Jr.; John R. Manning; Joseph H. Beumer

[57] ABSTRACT

An improved process for heating a material (20) within a fused silica ampoule by radiation through the wall of the ampoule (16), while simultaneously passing a cooling gas (22) around the ampoule, the radiation having passed through a screen (18) of fused silica so as to remove those components capable of directly heating the silica, thereby increasing the temperature of the material within the ampoule above the strain point of the ampoule, while maintaining the exterior of the ampoule cool enough to prevent rupturing the amp

4 Claims, 4 Drawing Figures

APPARATUS AND METHOD FOR HEATING A MATERIAL IN A TRANSPARENT AMPOULE

ORIGIN OF THE INVENTION

The invention described herein was made in performance of work under NASA Contract, and is subject to the provisions of Section 305 of the National Aeronautics and Space Act of 1968, Public Law 85-568 (72 Stat. 435,42 U.S.C. 2457).

TECHNICAL FIELD

This invention relates to an improved method and apparatus for heating materials within a fused silica ampoule.

BACKGROUND ART

Sealed ampoules of fused silica have been used for the growth of crystals of compounds, one constituent of which has a high vapor pressure, e.g., HgTe or $Hg_{1-x}Cd_xTe$, as proposed by W. D. Lawson et al, *J. Phys. Chem. Solids,* 9, 325 (1959).

The mechanism of crystal growth within the heated ampoules may include Bridgman growth, as disclosed by J. Blair et al, "Metallurgy of Elemental Compound Semiconductors", Interscience, New York (1961); zone growth, as disclosed by F. K. Heumann, *J. Electrochem. Soc.* 109, 345 (1962) or solid state recrystallization, as proposed by M. J. Brau in U.S. Pat. No. 3,656,944, herein incorporated by reference.

Regardless of the mechanism by which crystal growth occurs, the use of a fused silica container for crystal growth is almost universal. Fused silica can withstand temperatures up to 1100° C., is relatively inert, has good strength, and is easily cleaned.

An improved understanding of the implications of the spectral properties of radiation heat transfer through fused silica has lead to this invention for the purpose of controlling the radiation spectrum used to heat the contents of silica ampoules to temperatures in excess of the softening point of silica, while at the same time cooling the outside of the ampoule to preserve its mechanical strength. This invention is equally applicable to other materials than silica which are transparent to radiation such as alumina or glass.

There is a need to heat some materials to a high melting temperature for several crystal growth and refining processes, and often temperatures which threaten the integrity of the containing ampoule itself are necessary. There is therefore a need to develop a method for preserving the outside of the ampoule cooler than the interior which is in contact with the contents. See L. R. Holland, "A Thermal Transmission Function for Fused Silica Ampoules", *J. Crystal Growth* (July 1980).

DISCLOSURE OF INVENTION

It is therefore an object of this invention to provide a method of heating material in a fused silica ampoule wherein the material may be heated to a temperature above the strain point of the ampoule without rupturing the ampoule.

Another object is to provide apparatus for heating material in a silica ampoule to such temperature.

In accordance with this invention material is heated in a fused silica ampoule to a tempeature above the strain point of the ampoule by disposing the ampoule within a sleeve, passing a cooling gas between the ampoule and the sleeve and passing the heating radiation through the sleeve and ampoule to the material.

BEST MODE OF CARRYING OUT THE INVENTION

Fused silica, which is widely used for crystal growth, in sealed ampoules, cannot be considered either completely opaque or completely transparent to thermal radiation at temperatures at which crystal growth is practical.

Figure 1:
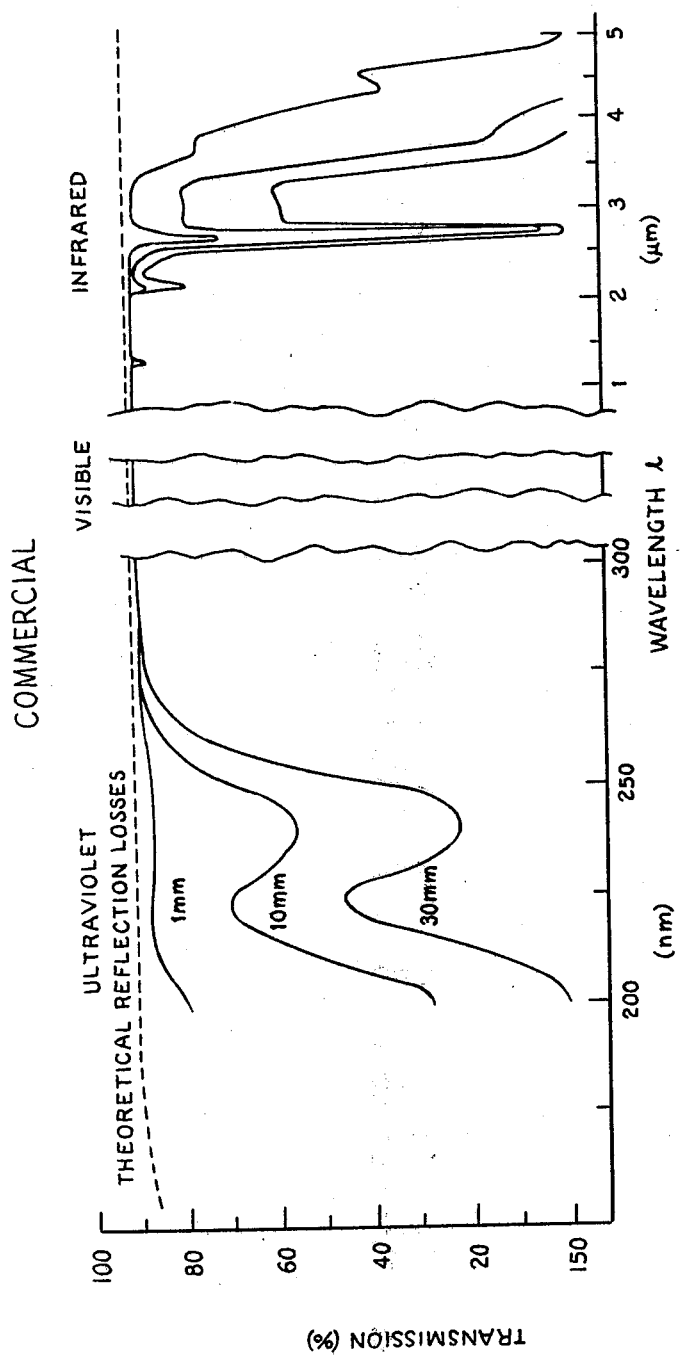
In FIG. 1 is shown the optical transmission of commercially available fused quartz plates of varying thicknesses, as reported in the literature.
Figure 2:
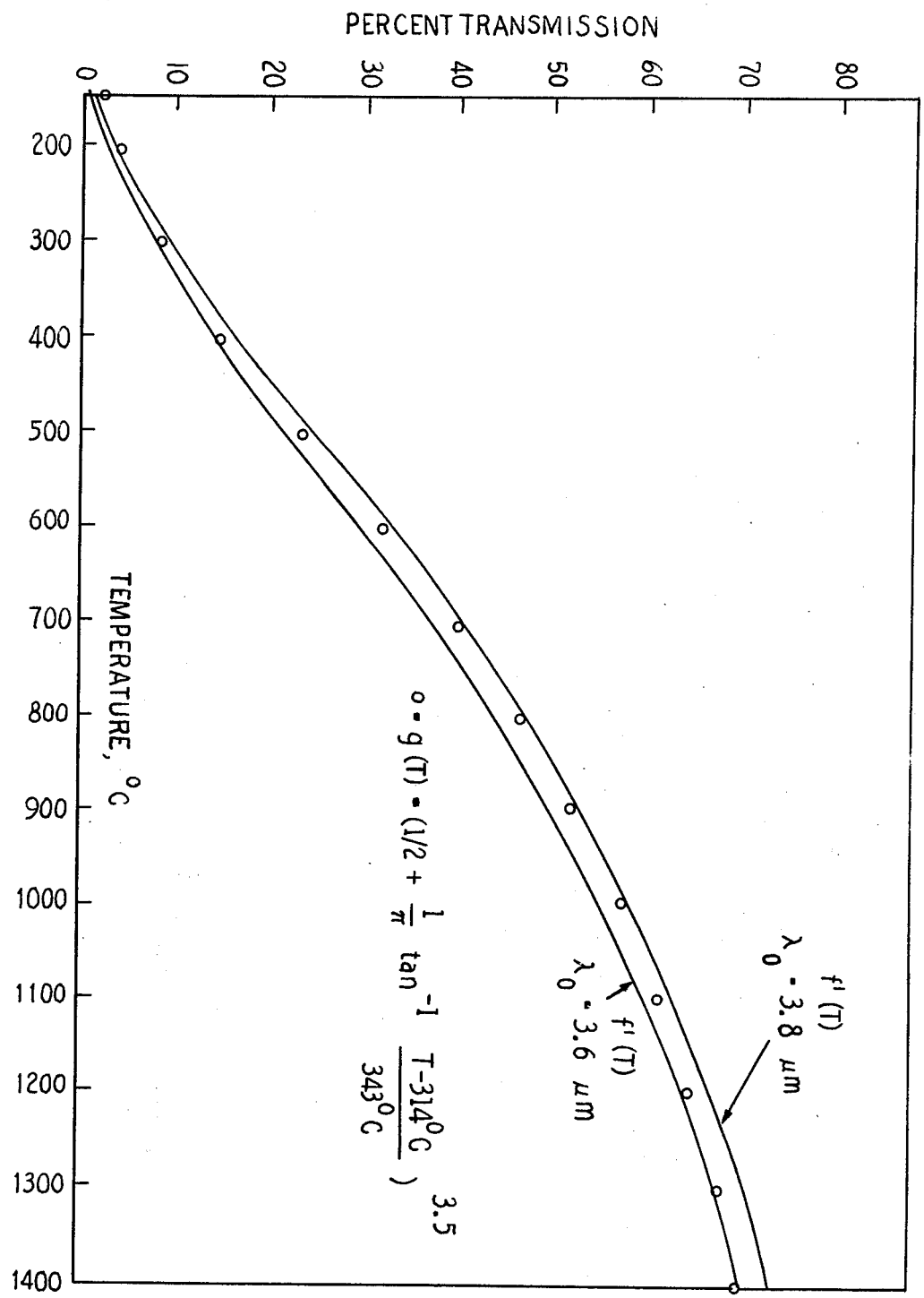
In FIG. 2 is shown a plot of transmission of heat for fused silica as a function of temperature employing the approximation of this invention.

As shown in FIG. 1, transmission of fused quartz varies widely over the electromagnetic spectrum. In the region from 270 nm to 3.7 µm, there is a nearly constant reflection loss of about five percent, for which an adjustment must be made. A sharp hydroxyl absorption line at 2.8 µm varies considerably according to the method by which the fused silica was produced. With special treatment, this absorption can almost be eliminated. Otherwise, fused silica of typical ampoule wall thickness is very transparent, from 270 nm to 3.7 µm.

In the context of this invention, the essential characteristic of black body spectra is the ratio of the power at wavelengths less than some λ to the total radiated power, $$f(\lambda,T) = \frac{\int_0^\lambda W d\lambda}{\int_0^\infty W d\lambda} \quad (1)$$

This ratio is tabulated at pages 6-154 of "American Institute of Physics Handbook, 2nd Ed.", McGraw-Hill Book Co., New York (1963), in terms of λT. The spectra for black bodies at different temperatures are therefore all included in a single function.

In principle, the net transmission of radiation through silica at any black body temperature is calculated by multiplying the black body function $W(\lambda,T)$ by the spectral transmission of FIG. 1 and integrating over all wavelengths. This, in fact, becomes unnecessary because the spectral transmission of silica can be taken as unity from 270 nm to 3.7 µm, and zero outside this range and still provide a sufficiently precise estimate. It is therefore sufficient to limit consideration of ranges: $\lambda<270$ nm, U.V.; 270 nm$<\lambda<3.7$ µm, visible; and $\lambda>3.7$ µm, I.R.

The function $f(\lambda, T)$ reaches $1.015\times10^{-2}$ at $\lambda T=0.145$ cm degree. At this point, if $\lambda=270$ nm, $T=5370°$ K. Thus, for a black or "grey" radiator at less than 5370° K., less than one percent of the radiation falls in the U.V. absorption range of silica. For any practical furnace arrangement, the U.V. absorption may be neglected. Assuming that the silica is perfectly transparent for $\lambda < 3.7$ μm and perfectly absorbing for $\lambda > 3.7$ μm, the transmission fraction will be $$f(3.7 \mu m, T) = \frac{\int_0^{3.7 \mu m} W d\lambda}{\int_0^{\infty} W d\lambda} \quad (2)$$

Radiation from the furnace at $T_F$ reaching the ampoule consists of a reflected fraction (5%), a fraction of $f'(T_F)$ transmitted toward the melt, with the remainder being absorbed at the silica surface. The surface transmits heat into the silica by phonon conduction and radiates heat outwardly, but only at those wavelengths for which it is opaque. Therefore, the heat balance boundary condition becomes $$\sigma T_F^4 [0.95 - f'(T_F)] = \sigma T_S^4 [0.95 - f'(T_S)] + k_S \frac{dT}{dr} \bigg|_S \quad (4)$$

wherein $\sigma$ is in the Stefan-Boltzmann constant, $T_S$ is the surface temperature, $k_S$ is the silica phonon conductivity, and $dT/dr|_S$ is the radial temperature gradient inside the surface. At the surface of the melt, the boundary condition is $$k_m \frac{dT}{dr} \bigg|_m + \sigma \epsilon_m f'(T_m) T_m^4 = k_S \frac{dT}{dr} \bigg|_S + \sigma \epsilon_m f'(T_F) T_F^4 \quad (5)$$

wherein the subscript m applies to the melt. In equations (4) and (5), the function f' is characteristic of the silica, but its argument is the temperature of the radiation source, in only one case the silica itself.

Figure 3:
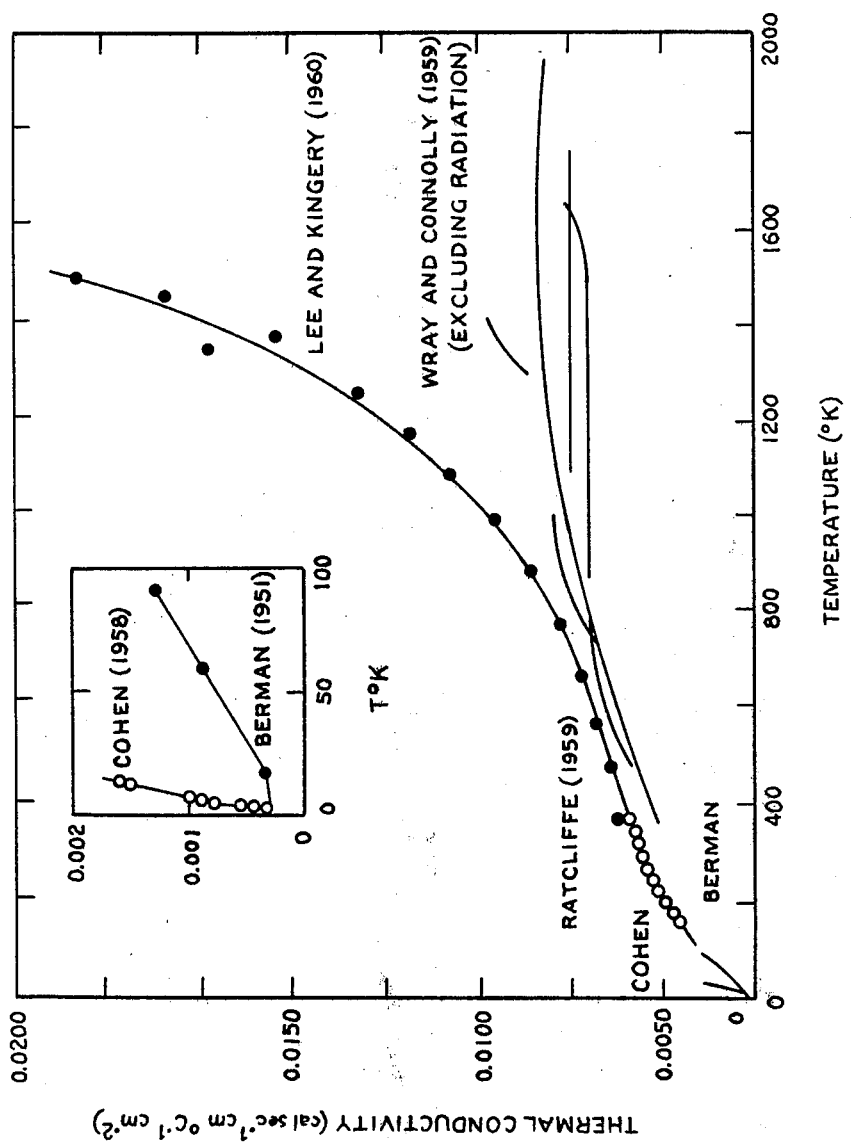
In FIG. 3 are given thermal conductivity of fused silica as a function of temperature, as reported in the literature.

In FIG. 3 are shown thermal conductivity for fused silica, as a function of temperature as reported by Kingery et al, "Introduction to Ceramics", (2nd ed.) John Wiley-Interscience, New York (1976) at 626.

Thermal conductivity shown in FIG. 3 includes that with and without a contribution from radiation. It will be appreciated that the radiation contribution depends on the temperature of the source and, for the purposes of the figure, must be taken as the temperature of the silica. The Wray and Connolly curve provided the conductivity $k_S$ used in equations (4) and (5). However, the total conductivity curve of Lee and Kingery is of little value when the radiation sources being used are at temperatures substantially different from the silica in question. In the typical sealed ampoule Bridgman growth arrangement, the furnace temperature, and hence the radiation contribution to the conduction, will be high.

A practical application of the large radiation transfer possible through fused silica is to use this "greenhouse" effect inside the ampoule, to obtain higher temperatures. If the furnace is maintained at a very high temperature and if the ampoule is shielded from it by an additional silica sleeve, the first term in equation (4) is suppressed, since very little absorbable radiation reaches the silica ampoule. The last term of equation (5) can still be large, with $f'(T_F)$ approaching 70 percent. The heat from the furnace is therefore delivered directly to the melt. A cooling gas passed between the ampoule and the concentric silica sleeve will remove heat conducted from the melt by the ampoule and heat from the furnace radiation intercepted by the screen. With the outside of the ampoule thus chilled, the contents of the ampoule can be raised to a temperature above the strain point of the silica, without the rupture that would otherwise inevitably occur. It will be understood that thus maintaining the outside of a silica ampoule relatively cool and rigid is possible only because fused silica has a notoriously low coefficient of thermal expansion. In any event, higher melt temperature and higher thermal gradients at a freezing interface can be achieved by using this property of silica.

A typical material which can be heated in a fused silica ampoule in accordance with the practice of this invention is mercury cadmium telluride (HgCdTe), which is a semiconductor alloy of CdTe and HgTe, preferably in 20:80 ratio. The resulting product is used as a wide band gap semiconductor for used in infrared detectors.

A major problem in handling melt used to make HgCdTe is the high vapor pressure of Hg over the material, which is given by the following formula:

$$P = e^{[10.206 - 7149/T]}$$

The pressure is in atmospheres and the temperature is that of the mercury cadmium telluride in degrees Kelvin. For example, at a temperature of 1473° Kelvin (1200° C.), the pressure is about 211 atm. See, J. Steininger, *The Journal of Electronic Materials*, 5, No. 3 (1976).

The fused silica ampoule containing the material being heated is contained within a concentric sleeve, which is preferably also of silica, of a heater.

In order to cool the surface of the ampoule, a cooling gas is flowed between the ampoule and the concentric sleeve. The cooling gas can be helium, at a flow rate of 3-5 pounds/hr at a temperature of 400°-600° F. (204°-316° C.). Ambient air, flowing by convection around the ampoule can also be used as the cooling gas.

In one preferred embodiment, process of the invention will be one wherein the concentric sleeve is silica, the material being heated within the fused silica ampoule is mercury cadmium telluride and the cooling gas is He at 200°-320° C. and having a flow rate of 3-5 pounds/hr.

Equally preferred is the case wherein the cooling gas is air, entering the space between the fused silica ampoule and the concentric sleeve by natural convection.

Without further elaboration, it is believed that one skilled in the art can, using the preceding description, utilize the present invention to its fullest extent. The following specific embodiments are, therefore, to be construed as merely illustrative and not limitative of the remainder of the disclosure in any way whatsoever.

EXAMPLE 1

A fused silica ampoule having an inside diameter of 8 mm, outside diameter of 12 mm and length of 200 mm is charged with a mixture of CdTe and HgTe (20:80) and sealed. The ampoule is placed inside a concentrically aligned heating apparatus having an inside diameter of 25.4 mm, to provide an annular space of 6.7 mm between the ampoule and the sleeve.

The ampoule is heated, up to a temperature of about 1000° C. at the outer surface of the fused silica ampoule, while He at an entrance temperature of about 260° C. is flowed through the annular space at a rate of about 4 pounds/hr.

EXAMPLE 2

An experiment is done, otherwise as in Example 1, in which the fused silica ampoule is cooled by convection of air.

The preceding examples can be repeated with similar success by substituting the generically or specifically described reactants and/or operating conditions of this invention for those used in the preceding examples.

Figure 4:
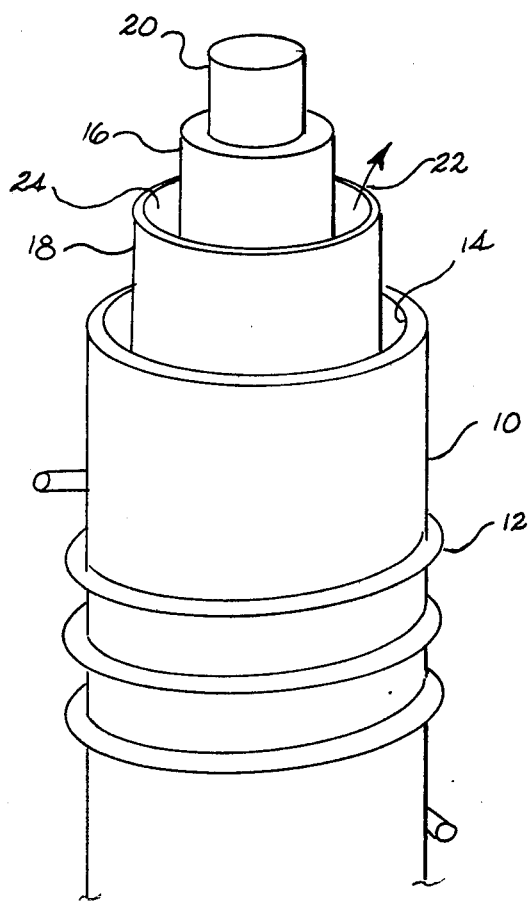
In FIG. 4 apparatus embodying the invention is depicted.

In accordance with the apparatus, furnace 10 having a heater winding 12 and core 14 is raised to a very high temperature such that the ampoule material 16 is transparent to a major fraction of the black body radiation originating at the furnace liner. Sleeve 18 provides a screen means whereby upon reaching the transparent screen, that portion of the spectrum to which the ampoule is not transparent is stopped, thus heating the screen. Most of the radiation which passes through the screen also penetrates the ampoule without being absorbed by or heating the outside of the ampoule. This radiation then goes to the charge 20 within the ampoule, heating the charge material. A cooling fluid or gas 22 is passed through a space 24 between the screen and the ampoule, thus removing the heated absorbed by the screen, and cooling the outside of the ampoule (FIG. 4). In this way, the inside of the ampoule may be maintained at a temperature above the softening point of the ampoule material, while the outside of the ampoule is maintained cool enough to preserve the mechanical integrity (e.g. bursting strength) of the ampoule. A "negative" temperature gradient (e.g. in cylindrical ampoules $dT/dr<0$) is thus maintained in the ampoule wall, with a conduction heat flux from the ampoule charge to the cooling gas.

In the case of ampoules of fused silica, the ampoules are essentially transparent to radiation of wavelengths shorter than $3.7\mu$ meters. Thus more than 75% of the radiation from a black body at or above 1600° C. will pass through them. This radiation may be used to heat a charge to more than 1300° C., a temperature at which fused silica softens. The cooling gas can be used to maintain the outside of the ampoule at less than 1000° C., in which case the outside portion will be quite rigid and may support and contain the softer inside part and the hot charge. Most of the radiation at wavelengths longer than $3.7\mu$ meters will be stopped by the silica screen, and thus will not be dissipated as heat at the ampoule. The screen is protected from melting by the gas flow which may be from a conventional source.

The screen may be spaced from the furnace or made integral with the furnace core such as by a coating glaze of material having the desired radiation emission properties applied to the core walls.

It is to be understood that the apparatus and method may be used with any transparent ampoule (glass, fused silica, transparent alumina, etc.) wherein the contents may be heated to a temperature above the softening point of the ampoule by encasing the ampoule in a screen or sleeve of like material or material having similar spectral properties so that radiation passed by the screen will also be passed by the ampoule to the contents therein.

From the foregoing description, one skilled in the art can easily ascertain the essential characteristics of this invention and, without departing from the spirit and scope thereof, can make various changes and modifications of the invention to adapt it to various usages and conditions.

I claim:

1. In a process for heating a material within a transparent ampoule by radiation through the wall of the ampoule, the improvement of disposing the ampoule within a sleeve, wherein the sleeve is of a material having similar spectral properties to that of said ampoule, passing a cooling gas between the ampoule and the sleeve to chill the outside of the ampoule while the temperature of the material within the ampoule is raised to thereby increase the temperature of the material within the ampoule above the strain point of the ampoule without rupturing the ampoule.

2. The process of claim 1, wherein the ampoule and sleeve material is fused silica.

3. The process of claim 2, wherein the material being heated within the fused silica ampoule is mercury cadmium telluride.

4. Apparatus for heating a material contained within a transparent ampoule disposed within a furnace to a temperature above the softening point of the ampoule comprising:

screen means disposed between said ampoule and said furnace formed from material having similar spectral properties as that of said ampoule so that the spectrum of radiation to which the ampoule is not transparent is stopped by said screen means; and a space defined between said screen means and said ampoule through which a cooling gas may flow for cooling the outside of said ampoule;

whereby the temperature of the material within the ampoule may be heated to a temperature above the strain point of the ampoule without rupturing the ampoule.

* * * * *